(12) United States Patent
Tamura (10) Patent No.: US 7,994,570 B2
(45) Date of Patent: Aug. 9, 2011

(54) SEMICONDUCTOR DEVICE AND METHOD OF MANUFACTURING THE SAME

(75) Inventor: Jun Tamura, Ohtsu (JP)

(73) Assignee: Renesas Electronics Corporation, Kanagawa (JP)

( * ) Notice: Subject to any disclaimer, the term of this patent is extended or adjusted under 35 U.S.C. 154(b) by 1 day.

(21) Appl. No.: 12/423,280

(22) Filed: Apr. 14, 2009

(65) Prior Publication Data

US 2009/0256195 A1    Oct. 15, 2009

(30) Foreign Application Priority Data

Apr. 15, 2008   (JP) .................................. 2008-105857

(51) Int. Cl.
*H01L 29/76*    (2006.01)

(52) U.S. Cl. ........ 257/330; 257/331; 257/334; 257/329; 257/E21.193; 257/E21.429

(58) Field of Classification Search .................. 257/330, 257/331, 334, 329, E21.193, E21.429
See application file for complete search history.

(56) References Cited

U.S. PATENT DOCUMENTS

2008/0099837 A1*   5/2008   Akiyama et al. .............. 257/341

FOREIGN PATENT DOCUMENTS

JP           11-177086           7/1999

* cited by examiner

*Primary Examiner* — Long Pham
(74) *Attorney, Agent, or Firm* — Young & Thompson (57) ABSTRACT

A semiconductor device in which current flows in a vertical direction includes a structure that decreases resistance between a source electrode and a drain electrode along with a current path at a position different from a position having highest electric field intensity between the source electrode and the drain electrode.

7 Claims, 13 Drawing Sheets

SEMICONDUCTOR DEVICE AND METHOD OF MANUFACTURING THE SAME

BACKGROUND

1. Field of the Invention

The present invention relates to a semiconductor device and a method of manufacturing the same, and more specifically, to a vertical MOSFET having a gate trench structure and a method of manufacturing the same.

2. Description of Related Art

There is a vertical Metal Oxide Semiconductor Field Effect Transistor (MOSFET) having a polysilicon electrode formed in a trench, which is formed in a surface of a silicon substrate. This is called gate trench structure. When an N-type FET having gate trench structure turns ON, current flows from a drain in a rear surface side of the silicon substrate to a source in a front surface side along with a channel part, which is formed on a surface opposed to a gate polysilicon electrode in a trench side surface.

In order to decrease a drain-source resistance in the vertical MOSFET, the impurity concentration of the silicon substrate (or epitaxial layer formed on the silicon substrate) in which the current flows can be increased. However, when the impurity concentration of the silicon substrate is increased for low ON resistance, a depletion region hardly extends to the silicon substrate and the electric field concentration readily occurs. As a result, a drain-source breakdown voltage (BVdss) becomes lower. According to a related vertical MOSFET, the drain-source breakdown voltage (BVdss) decreases when the ON resistance is to be decreased, as there is a trade-off relationship between them.

Figure 14:
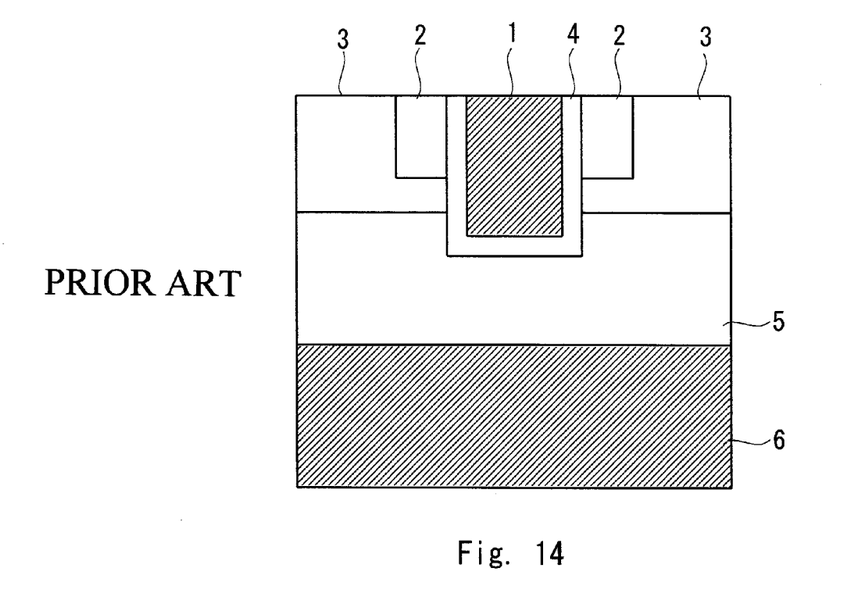
FIG. 14 is a cross sectional view showing a configuration example of a vertical MOSFET having a trench gate structure according to a related art.

FIG. 14 is a cross sectional view showing a configuration of a vertical MOSFET having a trench gate structure according to a related art. A low-concentrated epitaxial layer 5 is formed on a highly-concentrated substrate 6. A source layer 2 and a base layer 3 are formed inside the low-concentrated epitaxial layer 5. A trench is formed in the low-concentrated epitaxial layer 5 with etching process or the like. A gate layer 1 and a gate oxide film 4 are formed inside the trench. The base layer 3 is formed in a part opposed to a trench gate side wall. In the related semiconductor device, the ON resistance is made lower by decreasing the film thickness of the low-concentrated epitaxial layer 5 or by increasing the impurity concentration.

Figure 15:
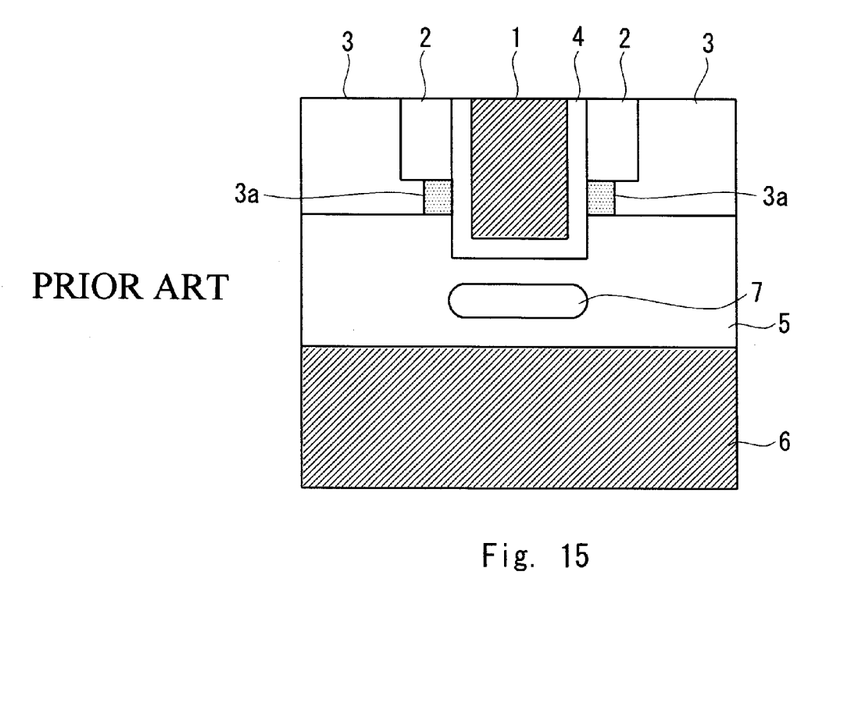
FIG. 15 is a cross sectional view showing a vertical MOSFET having a gate trench structure disclosed in a patent document 1.

FIG. 15 is a cross sectional view showing a vertical MOSFET having a gate trench structure disclosed in Japanese Unexamined Patent Application Publication No. 11-177086. In this vertical MOSFET, an island-shaped highly-concentrated region 7 is formed below the gate layer 1. The same components as those of FIG. 14 are denoted by identical reference symbols, and description thereof will be omitted. The island-shaped highly-concentrated region 7 is formed in the low-concentrated epitaxial layer 5 in a way that it is not formed immediately below a channel layer 3a formed in the base layer 3.

SUMMARY

The present inventors have now found a problem as follows. In the vertical MOSFET structure having the gate trench structure (FIG. 14), if the thickness of the low-concentrated epitaxial layer 5 is decreased or the impurity concentration of the epitaxial layer 5 is increased in order to the low ON resistance, the avalanche resistance (reach-through breakdown voltage) determined by the distance between a lower end of the base layer 3 and an upper end of the highly-concentrated substrate 6 and the punch-through breakdown voltage determined by the concentration difference between the base layer 3 and the low-concentrated epitaxial layer 5 dramatically decrease along with it.

On the other hand, in the vertical MOSFET (FIG. 15) disclosed in Japanese Unexamined Patent Application Publication No. 11-177086, the island-shaped highly-concentrated region 7 is formed by implanting ion only to the lower part of the trench. That is, no structure is disclosed in Japanese Unexamined Patent Application Publication No. 11-177086, which can decrease the ON resistance along with the current path.

A first exemplary aspect of an embodiment of the present invention is a semiconductor device that flows current in a vertical direction, including a structure that decreases resistance between a source electrode and a drain electrode along with a current path at a position different from a position having highest electric field intensity between the source electrode and the drain electrode.

In the first exemplary aspect of an embodiment of the present invention, a structure decreasing the drain-source resistance is formed along with the current path where is a different portion from the highest electric field intensity position between the source electrode and the drain electrode. As a result, the electric field concentration between the drain and the source does not occur in the depletion region formed in this structure. Accordingly, the resistance can be made lower effectively without decreasing the breakdown voltage between the drain and the source.

A second exemplary aspect of an embodiment of the present invention is a method of manufacturing a semiconductor device including a pair of gate layers formed to sandwich both sides of a source layer, the method including forming a first conductive type semiconductor layer on a semiconductor substrate, forming a first trench in a specific position of the semiconductor layer, forming a second trench having an opening width wider than an opening width of the first trench and an opening depth shallower than an opening depth of the first trench above the first trench, forming an insulating film and a gate layer in a step portion of the first trench and the second trench, forming a source layer between adjacent second trenches, and forming a first conductive type highly-concentrated impurity layer in a side surface of the first trench.

According to the present invention, by forming the highly-concentrated impurity layer in the side surface of the first trench, the highest electric field applied between the drain and the source is not applied to the depletion region generated in the highly-concentrated impurity layer. As a result, the resistance can be made lower without decreasing the breakdown voltage between the drain and the source.

A third exemplary aspect of an embodiment of the present invention is a method of manufacturing a semiconductor device including a pair of gate layers formed to sandwich both sides of a source layer, the method including forming a first conductive type semiconductor layer on a semiconductor substrate, forming a first trench in a specific position of the semiconductor layer, forming a second trench having an opening width wider than an opening width of the first trench and an opening depth shallower than an opening depth of the first trench above the first trench, forming an insulating film and a gate layer in a step portion of the first trench and the second trench, forming a source layer between adjacent second trenches, and forming a second conductive type semiconductor layer in a side surface of the first trench.

As stated above, by forming the second conductive type semiconductor layer in the side surface of the first trench, the first conductive type semiconductor layer and the second conductive type semiconductor layer are bonded to form so-called super junction structure. However, in a depletion region where the first conductive type semiconductor layer and the second conductive type semiconductor layer are produced in the bonding surface, the electric field applied between the drain and the source is made even on the bonding surface, and the electric field does not concentrate in a specific part. As such, the low resistance can be realized without decreasing the breakdown voltage between the drain and the source.

BRIEF DESCRIPTION OF THE DRAWINGS

The above and other exemplary aspects, advantages and features will be more apparent from the following description of certain exemplary embodiments taken in conjunction with the accompanying drawings, in which.

DETAILED DESCRIPTION OF THE EXEMPLARY EMBODIMENTS

Hereinafter, the exemplary embodiments of the present invention will be described with reference to the accompanying drawings.

First Exemplary Embodiment

Figure 1:
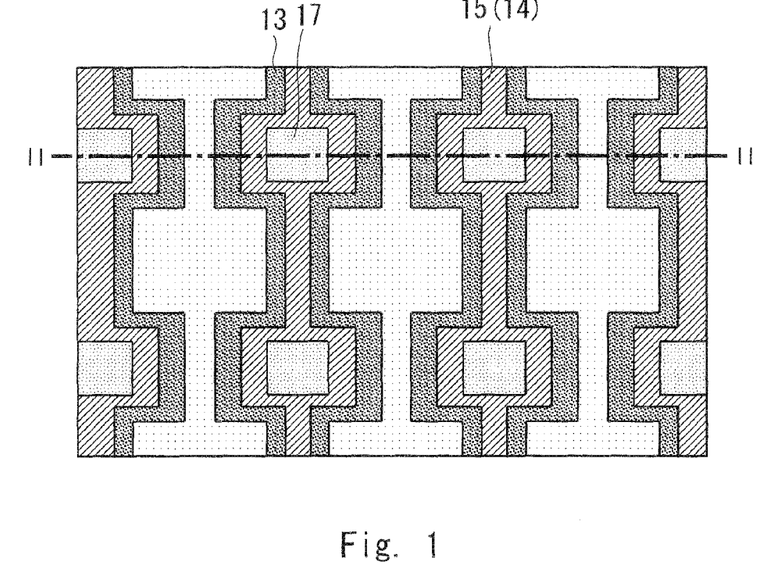
FIG. 1 is a plan view showing a configuration example of a semiconductor device according to a first exemplary embodiment of the present invention.
Figure 2:
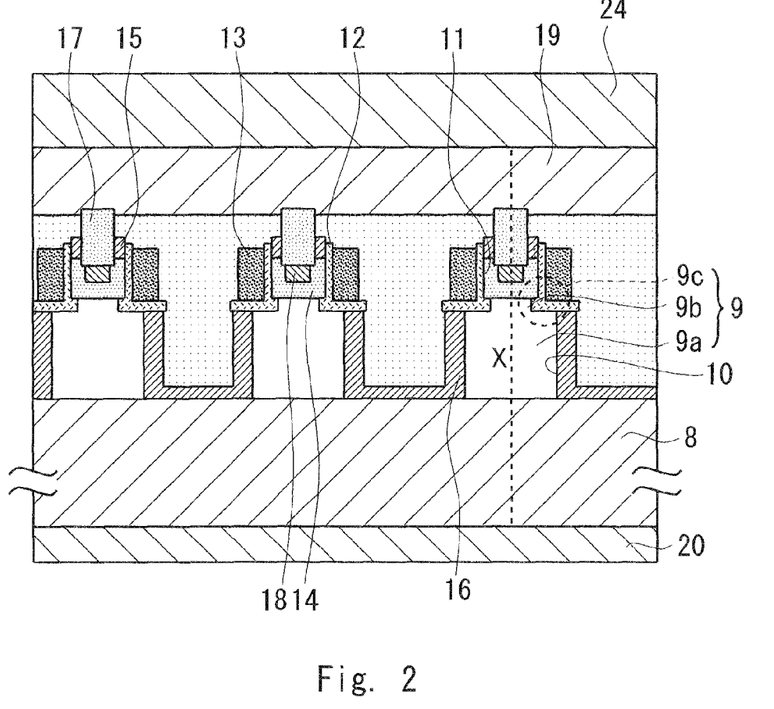
FIG. 2 is a cross sectional view taken along the line II-II of the semiconductor device shown in FIG. 1.

FIG. 1 is a plan view showing a configuration example of a semiconductor device according to the first exemplary embodiment of the present invention. FIG. 2 is a cross sectional view taken along the line II-II of the semiconductor device shown in FIG. 1. The first exemplary embodiment is applied to a vertical MOSFET having an N-type gate trench structure. In this semiconductor device, current flows in a vertical direction. The semiconductor device has a structure decreasing a resistance between a source electrode 19 and a drain electrode 20 in a portion different from the position where the electric field intensity between the source electrode 19 and the drain electrode 20 is the highest. In the first exemplary embodiment, the structure for decreasing the source-drain resistance is a highly-concentrated impurity layer 16 formed in the side surface of a lower semiconductor layer 9a. The dotted line X extending from the center of a source contact 17 to the drain electrode 20 represents the highest electric field impressed between the source electrode 19 and the drain electrode 20.

As shown in FIG. 2, an N-type epitaxial layer 9 is formed on a silicon substrate 8 (N-type highly-concentrated substrate). Then, a first trench 10 is formed in a desired position of the epitaxial layer 9. A second trench 11 is formed in an above portion of the first trench 10, and has an opening width wider than that of the first trench 10 and an opening depth shallower than that of the first trench 10. A convex-shaped epitaxial layer 9 is formed between the adjacent first trench 10 and the second trench 11.

Hereinafter, a part of the epitaxial layer 9 having a side surface of the first trench 10 is called a lower semiconductor layer 9a. Further, a part of the epitaxial layer 9 having a side surface of the second trench 11 and having a width narrower than that of the lower semiconductor layer 9a is called an upper semiconductor layer 9b. The side surface of the lower semiconductor layer 9a is a side surface of the first trench 10, and the side surface of the upper semiconductor layer 9b is a side surface of the second trench 11. A polysilicon 13 and a gate oxide film 12 that are insulating films are formed in a step portion 9c of the lower semiconductor layer 9a and the upper semiconductor layer 9b. In summary, a polysilicon 13 which is a gate layer is formed in the second trench 11. The polysilicon 13 functions as a gate electrode.

A highly-concentrated impurity layer 16 where the N-type highly-concentrated impurities are doped is formed between the side surface of the lower semiconductor layer 9a and the adjacent first trench 10 on the silicon substrate 8. In other words, the highly-concentrated impurity layer 16 is formed on the side surface and the bottom surface of the first trench 10. This highly-concentrated impurity layer 16 is formed to decrease the resistance of the area between the lower part of the polysilicon 13 and the silicon substrate 8 that functions as a current path in an ON state. Accordingly, the highly-concentrated impurity layer 16 needs to be formed in the side surface of the lower semiconductor layer 9a which is in the lower part of the polysilicon 13 (side surface of the first trench 10), but it may not be formed on the silicon substrate 8 (bottom surface of the first trench 10).

Further, a P-type base layer 14 and an N-type source layer 15 are formed in the upper semiconductor layer 9b between the two adjacent second trenches 11. The source layer 15 is formed in the both sides of the source contact 17. An identical voltage is concurrently applied to the source layers 15 in the both sides of the source contact 17, and a set of two source layers 15 form one source layer. The base layer 14 and the source layer 15 are formed to have a diffusion depth and an impurity concentration that do not produce punch-through. The base layer 14 and the source layer 15 are formed in the upper part of the bottom surface of the second trench 11. A part of the base layer 14 that is opposed to the side surface of the second trench 11 functions as a MOSFET channel. The source contact 17 is formed in a way that the base layer 14 and the source layer 15 are short-circuited, and functions so as not to produce snap-back (decrease of BVdss by the parasitic transistor operation) when voltage is applied between the drain and the source. The $P^+$-type highly-concentrated base layer 18 is formed to enhance contact property of the base layer 14.

A source electrode 19 is formed in the upper part of the source contact 17, and a drain electrode 20 is formed on the rear surface of the silicon substrate 8. As shown in the plan view of FIG. 1, the polysilicons 13 and the source layers 15 (base layers 14) are formed in a stripe shape, and are arranged substantially parallel with each other. The source contacts 17 are arranged substantially the center of the source layers 15 with a certain space interposed therebetween (including $P^+$-type base layer as well). Further, the source electrode 19 (not shown in FIG. 1) is formed all over an element forming region where the MOSFET is formed. The gate electrode (not shown) is formed away from the source electrode 19 with a certain space interposed therebetween, and is electrically connected to the polysilicon 13 in a position that is not shown. Further, a cover film 24 is formed so as to cover the source electrode 19.

Figure 3A:
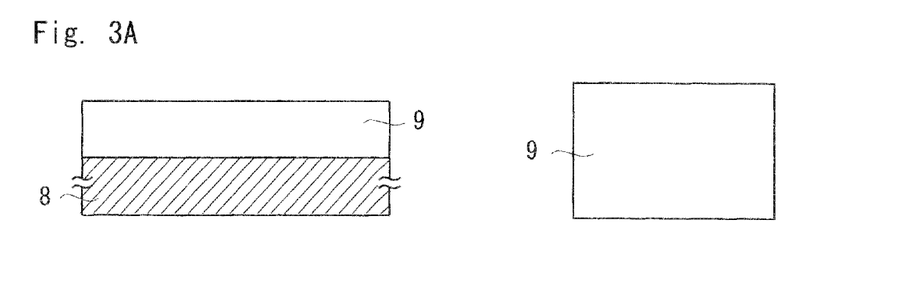
FIGS. 3A to 3D are cross sectional views showing a manufacturing process of the semiconductor device according to the first exemplary embodiment of the present invention.

Next, a method of manufacturing the semiconductor device according to the first exemplary embodiment thus formed will be described. FIGS. 3A to 6 show cross sectional views showing the manufacturing process of the semiconductor device according to the first exemplary embodiment of the present invention. In FIGS. 3A to 6, a left side of each drawing shows a cross sectional view of the semiconductor device, and a right side of each drawing shows a plan view corresponding to the cross sectional view. As shown in FIG. 3A, the N-type epitaxial layer 9 is formed on the silicon substrate 8 by epitaxial growth.

Figure 3B:
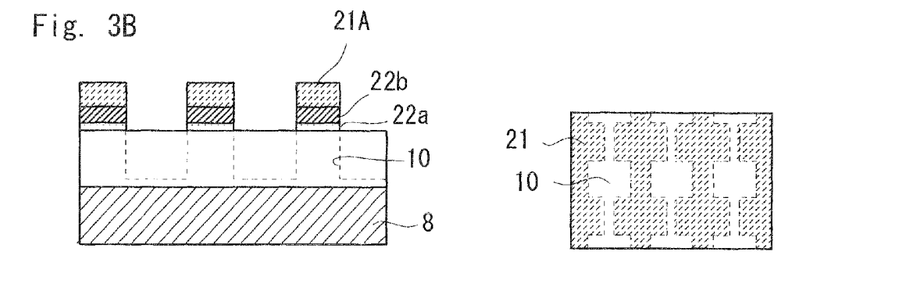

As shown in FIG. 3B, a thermal oxide film 22a, a first oxide film 22b, and a resist 21A are laminated in this order on the epitaxial layer 9. The first oxide film 22b can be formed by a CVD (Chemical Vapor Deposition) method. The resist 21A is patterned into a desired shape by a photolithography method to form a mask. The thermal oxide film 22a and the first oxide film 22b in a specific position are removed by dry etching using the resist 21A as masks, and the resist 21A is removed. After that, the epitaxial layer 9 is removed using the patterned thermal oxide film 22a and the first oxide film 22b as masks, so as to form a first trench 10. The depth of the trench that is to be etched is formed to be optimal in consideration of the required breakdown voltage between the drain and the source, and the relation with a second trench 11 that will be formed later. The width of the first trench 10 is preferably the one that enables to make the impurity concentration of the side surface and the bottom part of the trench substantially equal with each other in doping impurities in an oblique ion implantation performed in the later process. Then, the thermal oxide film 22a and the first oxide film 22b are removed.

Figure 3C:
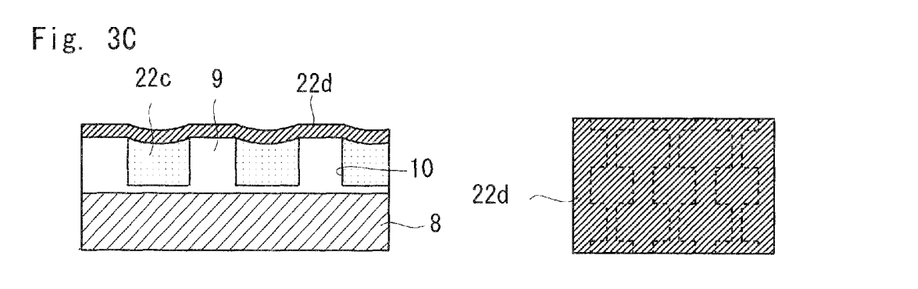

As shown in FIG. 3C, a second oxide film 22c is formed by the CVD method over the surface of the epitaxial layer 9 including the first trench 10. In other words, the second oxide film 22c is formed so as to bury the first trench 10. The second oxide film 22c is etched back to the opening of the first trench 10 to planarize the second oxide film 22c. A third oxide film 22d is formed by the CVD method to cover the whole surface of the silicon substrate 8.

Figure 3D:
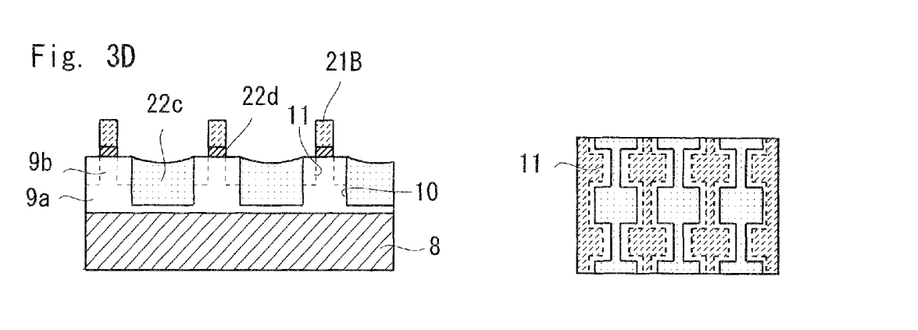

As shown in FIG. 3D, after a resist 21B is formed on the whole surface, it is formed into a desired pattern by photolithography. Then, dry etching is carried out using the third oxide film 22d that is patterned as a mask after removing the resist 21B, and the epitaxial layer 9 in a specific position is removed to form a second trench 11. The lower semiconductor layer 9a and the upper semiconductor layer 9b are formed in the epitaxial layer 9.

Figure 4A:
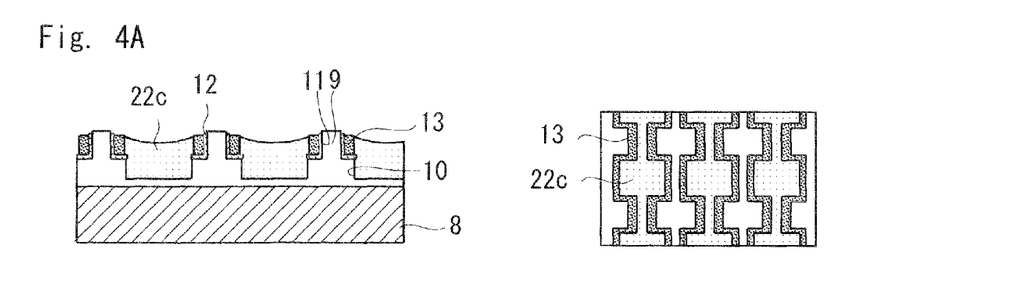
FIGS. 4A to 4D are cross sectional views showing a manufacturing process of the semiconductor device according to the first exemplary embodiment of the present invention.

As shown in FIG. 4A, a gate oxide film 12 is formed on the side surface of the second trench 11. The polysilicon 13 is grown on the whole surface of the gate oxide film 12, followed by etch back thereof. As such, the polysilicon 13 is formed in the step portion 9c of the lower semiconductor layer 9a and the upper semiconductor layer 9b.

Figure 4B:
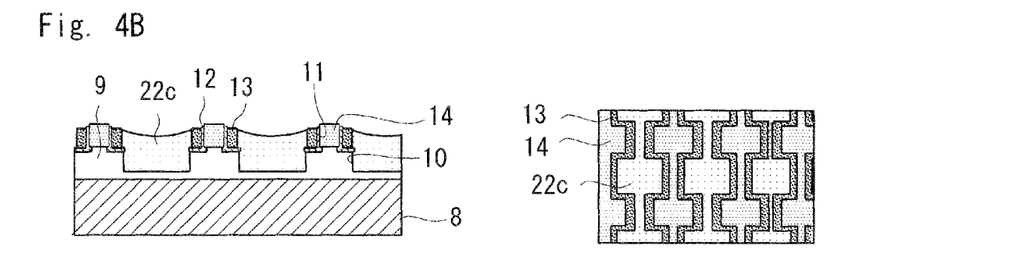

As shown in FIG. 4B, a base layer 14 is formed by ion implantation using the polysilicon 13 and the second oxide film 22c as masks.

Figure 4C:
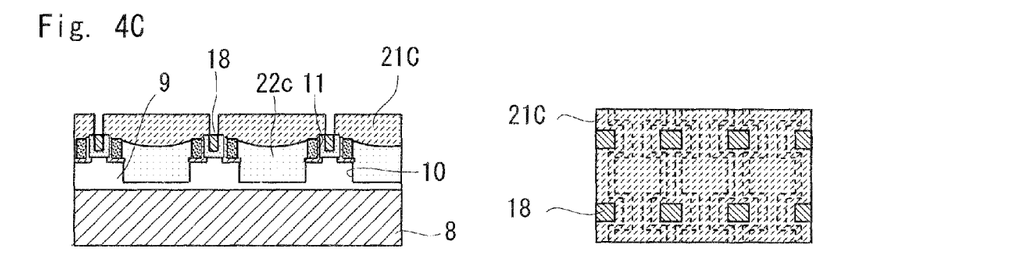

As shown in FIG. 4C, a resist 21C is formed to have a desired pattern by photolithography. Then, a highly-concentrated base layer 18 is formed by ion implantation using the resist 21C as a mask.

Figure 4D:
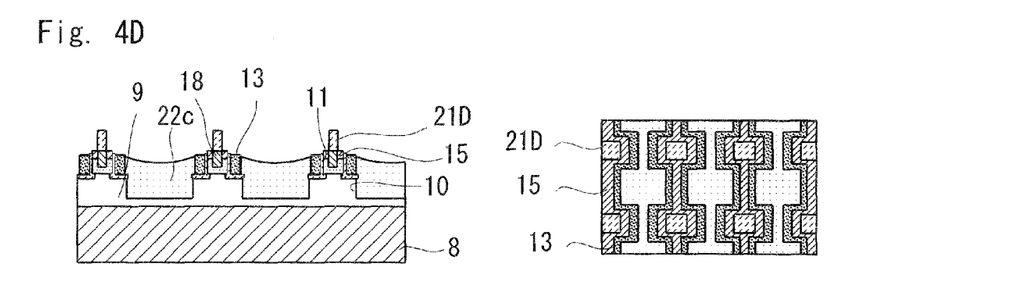

As shown in FIG. 4D, a resist 21D is formed to have a desired pattern by photolithography. Then, a source layer 15 is formed by ion implantation using the resist 21D and the second oxide film 22c as masks. The base layer 14, the highly-concentrated base layer 18, and the source layer 15 are formed above the bottom surface of the second trench 11

Figure 5A:
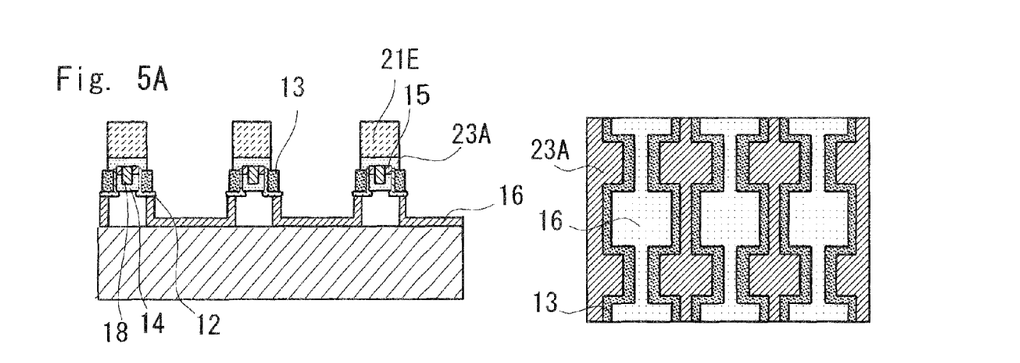
FIGS. 5A to 5D are cross sectional views showing a manufacturing process of the semiconductor device according to the first exemplary embodiment of the present invention.

As shown in FIG. 5A, after forming the first interlayer insulating film 23A on the whole surface, a resist 21E is deposited on the whole surface. Then, the resist 21E is patterned into a desired shape by photolithography. The second oxide film 22c and the first interlayer insulating film 23A inside the first trench 10 are removed by dry etching using the resist 21E as a mask. Then, the resist 21E is removed. Using the first interlayer insulating film 23A and the polysilicon 13 that are not removed as masks, the highly-concentrated impurity layer 16 is formed by oblique ion implantation.

Figure 5B:
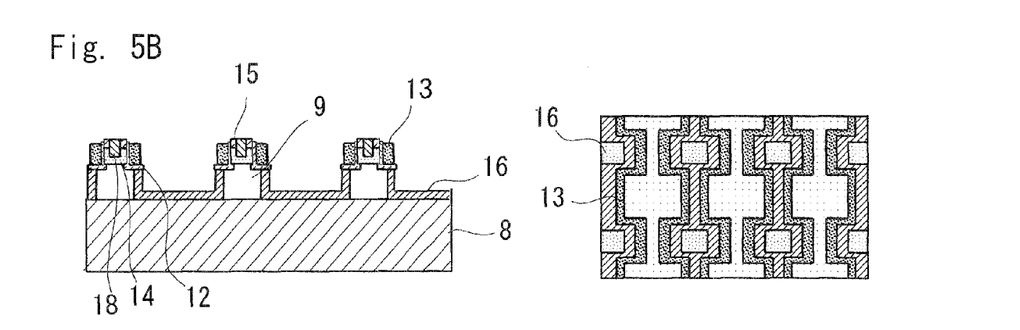

As shown in FIG. 5B, the first interlayer insulating film 23A is removed by oxide film etching.

Figure 5C:
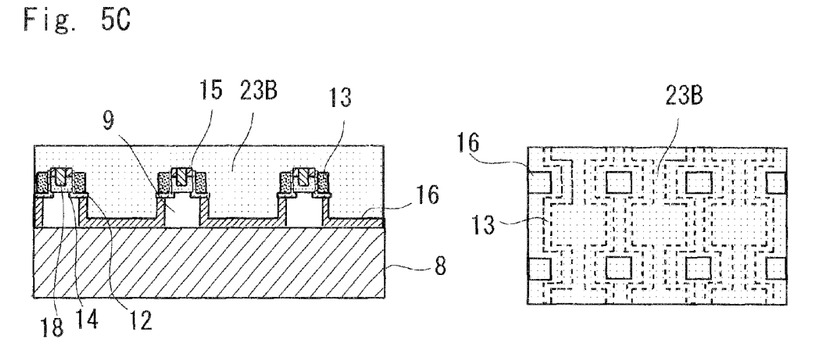

As shown in FIG. 5C, a second interlayer insulating film 23B is grown on the whole surface including the first trench 10, followed by planarization of the surface thereof by a CMP (Chemical Mechanical Polishing) or the like.

Figure 5D:
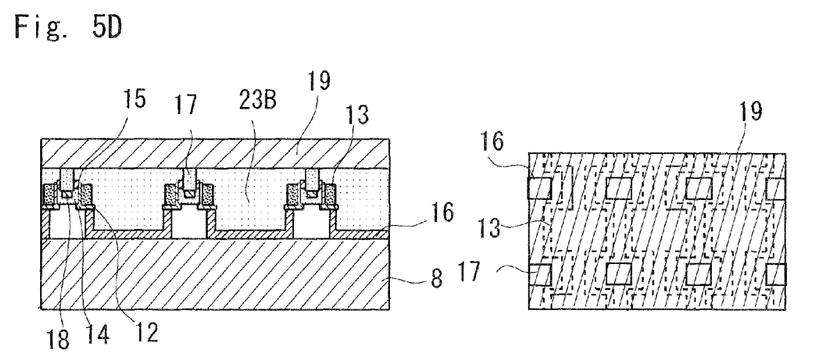

As shown in FIG. 5D, the opening for the source contact 17 is formed by photolithography and dry etching. Then, a blanket tungsten or the like that will be the source contact 17 is formed in the opening. The electrode metal which will be the source electrode 19 and the gate electrode (not shown) is formed by aluminum.

Figure 6:
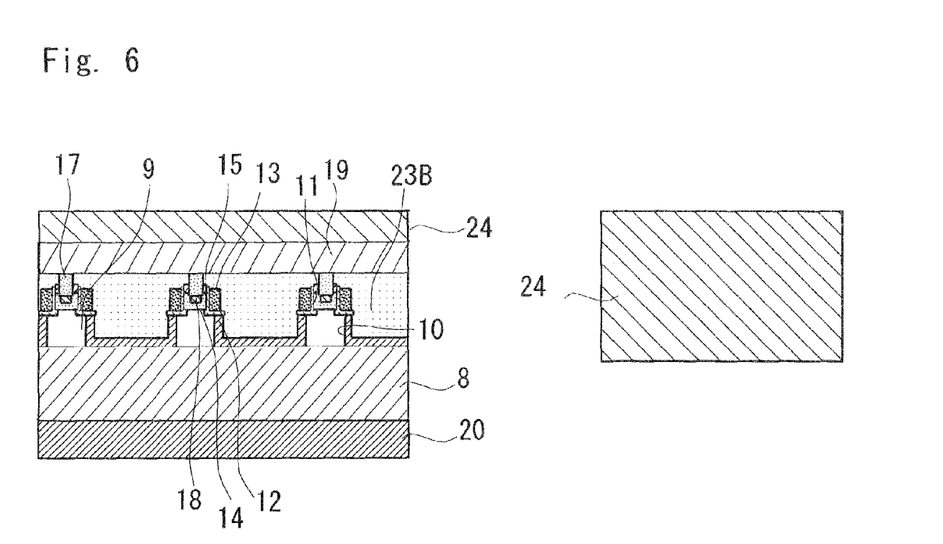
FIG. 6 is a cross sectional view showing a manufacturing process of the semiconductor device according to the first exemplary embodiment of the present invention.

As shown in FIG. 6, a cover film 24 is grown to cover the source electrode 19. After forming a wafer to have a desired thickness by wafer grinding or the like, a drain electrode 20 is formed on the rear surface by metal evaporation. Thus, the semiconductor device shown in FIG. 2 is completed.

In the semiconductor device shown in FIG. 2 thus manufactured, when the voltage of threshold voltage or more is applied between the gate and the source so that the P-type base layer 14 is inverted to n-type, the current flows between the drain and the source, and the MOSFET is turned on. The area where the current flows as the base layer 14 is inversed is called channel. In a case of N-type MOSFET, the current in ON state flows in the current path of the drain (silicon substrate 8), the side surface of the first trench 10, the bottom surface of the second trench 11 (immediately below the bottom surface of the polysilicon 13), the base layer 14 (side surface of the second trench 11), and the source layer 15 in this order.

In the first exemplary embodiment, by forming the highly-concentrated impurity layer 16 in the side surface of the lower semiconductor layer 9a, the structure that realizes low resistance can be provided along with the current path of the side surface of the first trench 10. As the highly-concentrated impurity layer 16 is formed along with the current path, the ON resistance per unit channel width can be reduced.

Further, in the semiconductor device, the highest electric field intensity that is produced between the source electrode 19 and the drain electrode 20 is on the straight line from the area immediately below the source contact 17 to the drain electrode 20 shown by the dotted line X (FIG. 2). However, in the first exemplary embodiment, the highly-concentrated impurity layer 16 is arranged in a position other than the area immediately below the source contact 17. Thus, it is possible to prevent the high voltage from being applied to the depletion region formed in the highly-concentrated impurity layer 16, whereby the decrease of the breakdown voltage between the drain and the source can be prevented. Accordingly, it is possible to effectively decrease the ON resistance while keeping the high breakdown voltage.

Further, according to the manufacturing method of the present invention, the highly-concentrated impurity layer 16 is formed after forming the gate oxide film 12. That is, the highly-concentrated impurity layer 16 is not toward the base layer 14 by the heat treatment. Thereby, it can prevent the decrease of BVdss.

It should be noted that, when the P-channel semiconductor is formed as a vertical MOSFET having a trench gate structure, N and P of each layer in the first exemplary embodiment is switched.

In the first exemplary embodiment, the base layer 14 and the source layer 15 are formed after forming the first trench 10 and the second trench 11. However, the first trench 10 and the second trench 11 may be formed after forming the base layer 14 and the source layer 15.

Figure 7:
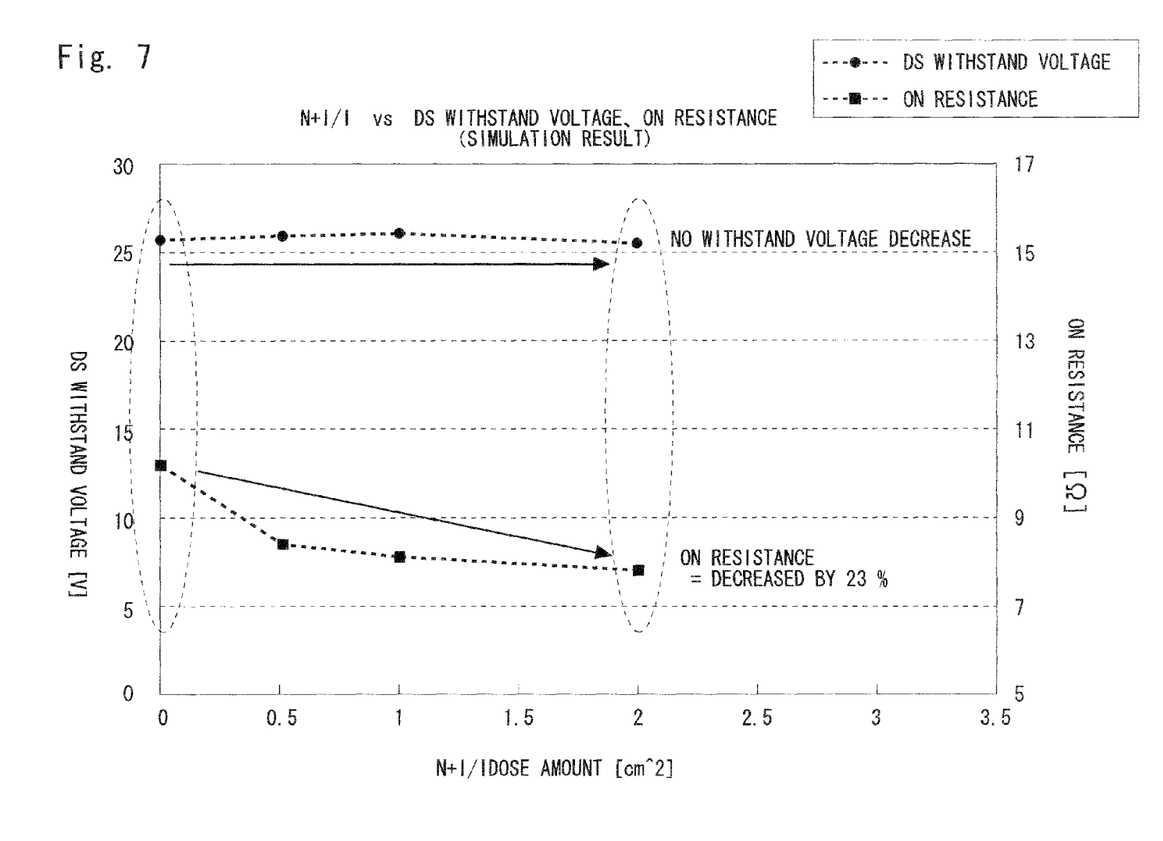
FIG. 7 shows a result of estimating the performance of the semiconductor device according to the first exemplary embodiment of the present invention by simulation.

FIG. 7 shows a result of estimating the performance of the semiconductor device according to the first exemplary embodiment of the present invention by performing simulation. The horizontal axis shows a dose amount [$cm^2$] of oblique ion implantation in forming the highly-concentrated impurity layer 16 inside the first trench 10, and the vertical axis shows BVdss[V] and ON resistance [$\Omega$]. Further, when the impurity concentration of the epitaxial layer 9 is $2.0 \times 10^{16}$ [$cm^3$], the highly-concentrated impurity layer 16 is set to the impurity concentration having a peak of about $1.2 \times 10^{17}$ [$cm^{-3}$] to $5.0 \times 10^{17}$ [$cm^{-3}$], whereby the ON resistance can be reduced by 23% without decreasing BVdss.

Second Exemplary Embodiment

Figure 8:
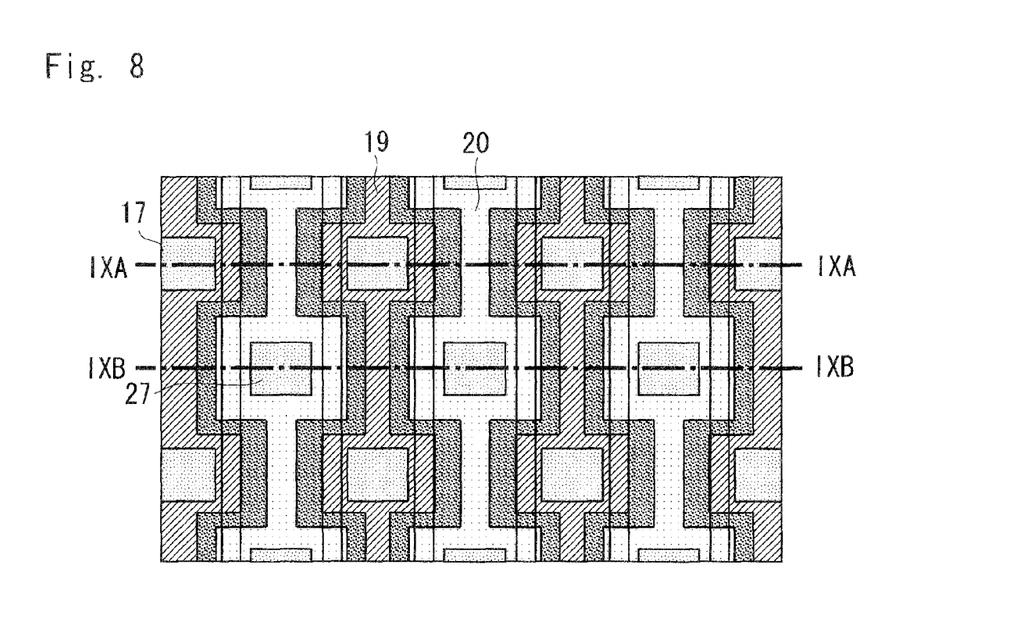
FIG. 8 is a plan view of a semiconductor device according to a second exemplary embodiment of the present invention.
Figure 9A:
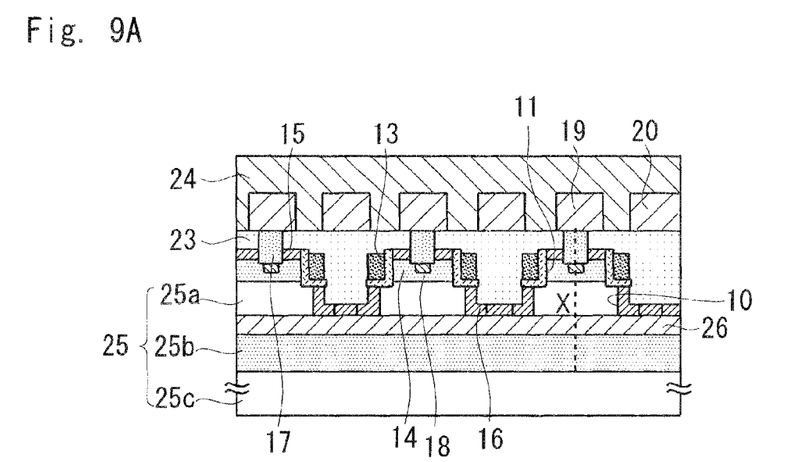
FIG. 9A is a cross sectional view taken along the line IXA-IXA of FIG. 8.
Figure 9B:
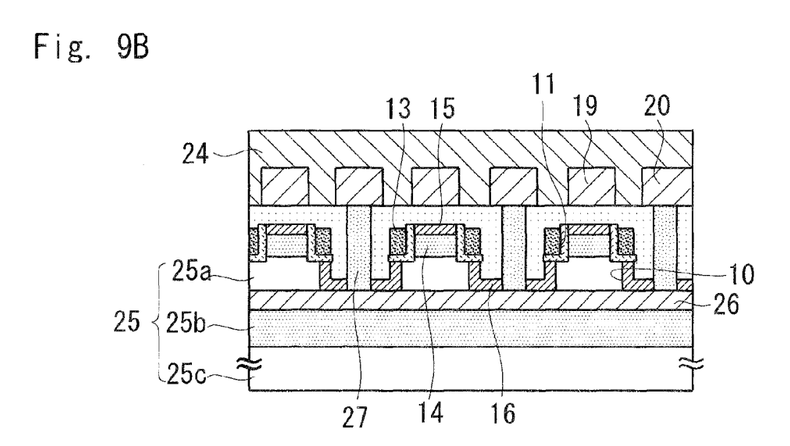
FIG. 9B is a cross sectional view taken along the line IXB-IXB of FIG. 8.

FIG. 8 is a plan view of the semiconductor device according to the second exemplary embodiment of the present invention. FIG. 9A is a cross sectional view taken along the line IXA-IXA of FIG. 8, and FIG. 9B is a cross sectional view taken along the line IXB-IXB of FIG. 8. The characteristics of the second exemplary embodiment lies in that the drain electrode 20 formed on the rear surface of the silicon substrate 8 in the first exemplary embodiment is formed in the front surface of the silicon substrate 8 in the second exemplary embodiment. In the second exemplary embodiment, a drain contact 27 is formed from the highly-concentrated impurity layer 16 to the drain electrode 20 in order to pull up the current flowing into the highly-concentrated impurity layer 16 from the source layer 15 to the drain electrode 20 in the upper layer. It should be noted that the structure to decrease the resistance between the source electrode 19 and the drain electrode 20 in the second exemplary embodiment is the highly-concentrated impurity layer 16 formed on the side surface of the lower semiconductor layer 9a, as is similar to the first exemplary embodiment.

In the second exemplary embodiment, an SOI substrate or a buried substrate in which $SiO_2$ is inserted between an Si substrate and a surface Si layer in advance is used in place of the silicon substrate 8 of the first exemplary embodiment. An SOI substrate 25 is formed by laminating a support substrate 25c, a buried oxide film layer 25b, and an active layer 25a. Further, a drain layer 26 into which the highly-concentrated N-type impurities are doped is formed between the active layer 25a and the buried oxide film layer 25b. The active layer 25a corresponds to the epitaxial layer 9 in the first exemplary embodiment. The drain contact 27 is formed to contact with the highly-concentrated impurity layer 16 and the drain layer 26. The drain contact 27 is connected to the drain electrode 20 in the upper layer. Note that, when a desired low ON resistance can be obtained only by the current path from the highly-concentrated impurity layer 16 through the drain contact 27, the drain layer 26 may be omitted.

FIGS. 10A to 11B are cross sectional views showing a manufacturing process of the semiconductor device according to the second exemplary embodiment of the present invention. Note that the manufacturing process in the second exemplary embodiment is substantially the same to the process of the manufacturing process in the first exemplary embodiment in FIGS. 3A to 5C, and therefore, the description thereof will be omitted. The process after FIG. 5C will be described with reference to FIG. 10A to FIG. 11B.

Figure 10A:
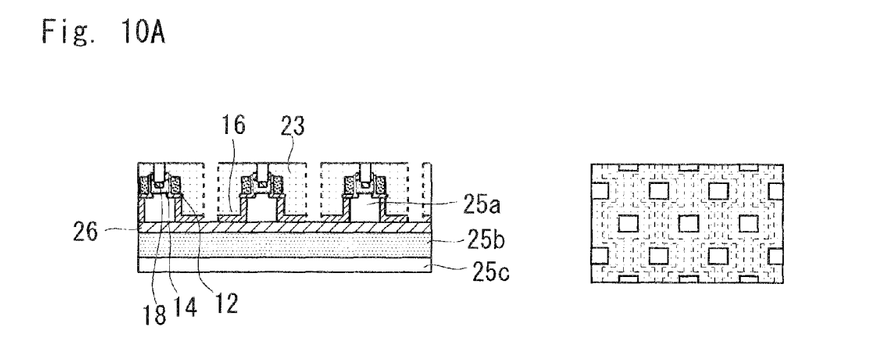
FIG. 10A is a cross sectional view showing a manufacturing process of the semiconductor device according to the second exemplary embodiment of the present invention.

In the manufacturing process of the second exemplary embodiment, as shown in FIG. 10A, the drain contact 27 is formed inside the first trench 10 at the same time when the source contact 17 is formed.

Figure 10B:
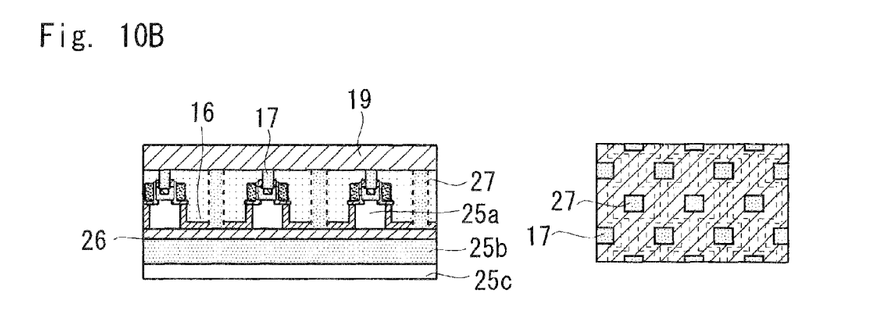
FIG. 10B is a cross sectional view showing a manufacturing process of the semiconductor device according to the second exemplary embodiment of the present invention.

Further, as shown in FIG. 10B, the metal electrode which will be the source electrode 19 and the drain electrode 20 is formed on the whole surface.

Figure 11A:
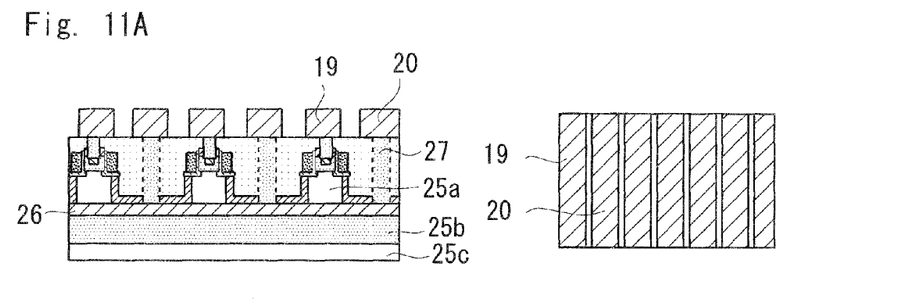
FIG. 11A is a cross sectional view showing a manufacturing process of the semiconductor device according to the second exemplary embodiment of the present invention.

As shown in FIG. 11A, the source electrode 19 and the drain electrode 20 are formed by carrying out patterning by etching.

Figure 11B:
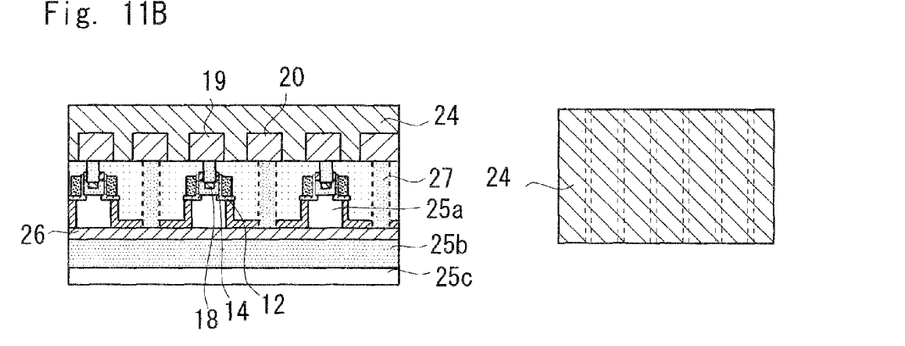
FIG. 11B is a cross sectional view showing a manufacturing process of the semiconductor device according to the second exemplary embodiment of the present invention.

As shown in FIG. 11B, the cover film 24 is formed to cover the source electrode 19 and the drain electrode 20. The drain contact 27 and the drain electrode 20 are formed away from the source electrode 19, the source contact 17, and the polysilicon 13 with a certain interval so as to be able to secure the breakdown voltage between the drain and the source, and the drain and the gate. As such, the semiconductor device shown in FIGS. 9A and 9B is completed.

Now, when the vertical MOSFET is mounted on a part of the circuit by a PoIC (Power Integrated Circuit) or the like, the drain electrode 20 needs to be formed on the front surface of the silicon substrate 8. In summary, although it is needed to pull up the ON current that flows from the source of the element front surface to the lower drain to the drain electrode 20 formed in the element front surface side again, the present invention can be applied to the PoIC as well by forming the drain contact 27 to contact to the drain electrode 20.

Although the resistance (pull-up resistance) is produced in the path of pulling up the current as the current path by the drain contact 27, which increases ON resistance, the increase of the ON resistance can be suppressed to the minimum by forming the drain layer 26 in the lower part of the element forming region of the SOI substrate and the buried substrate in advance and connecting the drain contact 27 to the drain layer 26.

According to the second exemplary embodiment, the drain layer 26 is not necessary as the highly-concentrated impurity layer 16 functions as the drain layer 26, which means the process of forming the highly-concentrated impurity layer can be eliminated. Thus, the manufacturing cost can be reduced. Although it may not he able to eliminate the highly-concentrated impurity layer in other circuits, only the ON resistance is further reduced as MOSFET, which does not cause any disadvantage even in this case.

Although the effect of reducing the resistance is made larger when the source electrodes 19 and the drain electrodes 20 are arranged in substantially parallel (stripe shape) in the plane pattern, they may be arranged in cell shape in order to reduce the scale of the element area. Further, as the part between the gate and the drain and the part between the source and the drain are insulated by the interlayer insulating film buried in the first trench 10, the source electrode can be arranged near the drain electrode as a plane layout, whereby the effect of reducing the resistance can be made larger.

In the second exemplary embodiment, the above effect can be attained without adding any special process, and thus, it can be applied to the related semiconductor device without additional cost.

In the second exemplary embodiment, the base layer 14 and the source layer 15 are formed after forming the first trench 10 and the second trench 11 as in the same way as the first exemplary embodiment, this manufacturing order may be reversed.

Third Exemplary Embodiment

Figure 12:
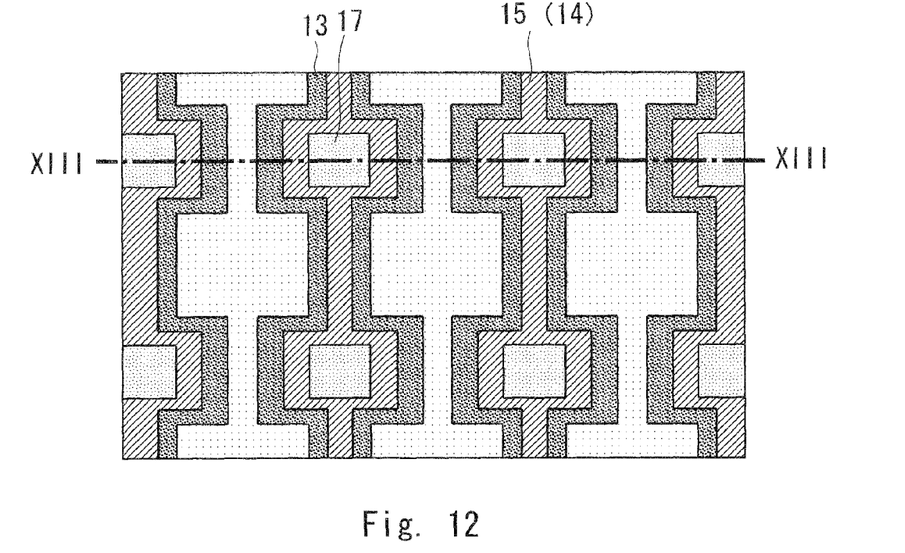
FIG. 12 is a plan view of a semiconductor device according to a third exemplary embodiment of the present invention.
Figure 13:
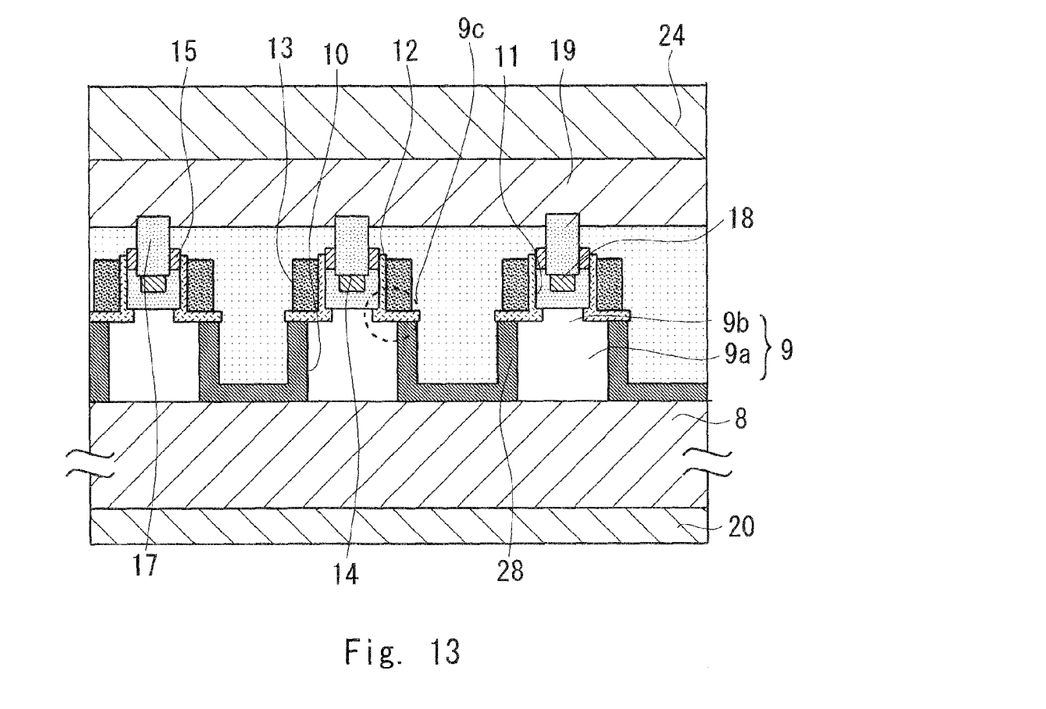
FIG. 13 is a cross sectional view taken along the line XIII-XIII of FIG. 12.

FIG. 12 is a plan view of a semiconductor device according to the third exemplary embodiment of the present invention, and FIG. 13 is a cross sectional view taken along the line XIII-XIII of the semiconductor device shown in FIG. 12. In this example, the N-type epitaxial layer 9 in the first and second exemplary embodiments are made P-type epitaxial layer. If the P-type epitaxial layer 9 is used in the first and second exemplary embodiments, the N-type epitaxial layer is used in the third exemplary embodiment.

In the N-type semiconductor layer 28, the N-type impurity concentration and the P-type epitaxial layer 9 satisfy the condition to form a super junction structure. Further, the current flows through the side surface of the first trench 10 flows between the silicon substrate 8 and the drain electrode 20 through the N-type semiconductor layer 28. As the manufacturing process is substantially the same as that of the first exemplary embodiment, the description thereof will be omitted.

The third exemplary embodiment employs the super junction structure, which can be applied to a MOSFET where the higher breakdown voltage of BVdss is required compared with the first and second exemplary embodiments. Especially, the high controllability of the position and the concentration of the P layer and the N layer is required in order to form the super junction structure. In the third exemplary embodiment, the N-type semiconductor layer 28 is formed in the side surface of the first trench 10, whereby the stable property having high controllability of the position and smaller variations can be attained.

When the vertical MOSFET having the super junction structure is formed, the N layer is formed in the side surface and the bottom surface of the first trench 10 after completion of the high-temperature heat treatment process. Accordingly, the controllability of the position and the concentration is made higher, and the super junction structure having smaller characteristic variations can be readily formed.

The first, second, and third exemplary embodiments can be combined as desirable by one of ordinary skill in the art.

While the invention has been described in terms of several exemplary embodiments, those skilled in the art will recognize that the invention can be practiced with various modifications within the spirit and scope of the appended claims and the invention is not limited to the examples described above.

Further, the scope of the claims is not limited by the exemplary embodiments described above.

Furthermore, it is noted that, Applicant's intent is to encompass equivalents of all claim elements, even if amended later during prosecution.

What is claimed is:

1. A semiconductor device in which current flows in a vertical direction, comprising:
   a semiconductor layer including a lower semiconductor layer and an upper semiconductor layer formed on the lower semiconductor layer and having a width different from a width of the lower semiconductor layer;
   a gate layer formed in a step portion between the lower semiconductor layer and the upper semiconductor layer;
   a source layer formed on the upper semiconductor layer and contacted to the gate layer through an insulating film, and
   a resistance decreasing structure decreasing resistance between a source electrode and a drain electrode along with a current path at a position different from a position having highest electric field intensity between the source electrode and the drain electrode.

2. The semiconductor device according to claim 1, wherein the resistance decreasing structure is formed in a side surface of the lower semiconductor layer.

3. The semiconductor device according to claim 2, further comprising:
   a drain electrode provided in an upper layer of the semiconductor layer; and
   a drain contact electrode layer connected to the highly-concentrated impurity layer and extended from the highly-concentrated impurity layer to the drain electrode.

4. A semiconductor device, comprising:
   a semiconductor substrate;
   a semiconductor layer including a first conductive type first highly-concentrated impurity layer formed on the semiconductor substrate, a first conductive type lower semiconductor layer formed on the first highly-concentrated impurity layer and having a width narrower than a width of the first highly-concentrated impurity layer, and a first conductive type upper semiconductor layer formed on the lower semiconductor layer and having a width narrower than a width of the lower semiconductor layer;
   a gate layer formed in a step portion between the lower semiconductor layer and the upper semiconductor layer;
   an insulating film formed between the lower semiconductor layer and the gate layer;
   a first conductive type source layer formed in the upper semiconductor layer and contacted to the gate layer through the insulating film;
   a source contact layer contacted to the source layer;

a second conductive type base layer formed in the upper semiconductor layer, contacted to the source contact layer, and opposed to the gate layer through the insulating film; and a first conductive type second highly-concentrated impurity layer formed in a side surface of the lower semiconductor layer.

5. The semiconductor device according to claim 4, further comprising:

a drain electrode provided in an upper layer of the semiconductor layer; and a drain contact layer connected to the first highly-concentrated impurity layer and extended from the lower semiconductor layer to the drain electrode.

6. The semiconductor device according to claim 4, wherein the base layer includes a second conductive type highly-concentrated base layer in a part contacted to the source contact layer.

7. A semiconductor device according to claim 2, wherein the resistance decreasing structure is a highly-concentrated impurity layer.

* * * * *